United States Patent
Noda

(10) Patent No.: US 9,190,455 B2
(45) Date of Patent: Nov. 17, 2015

(54) SEMICONDUCTOR MEMORY DEVICE AND PRODUCTION METHOD THEREOF

(71) Applicant: KABUSHIKI KAISHA TOSHIBA, Minato-ku (JP)

(72) Inventor: Kotaro Noda, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/021,085

(22) Filed: Sep. 9, 2013

(65) Prior Publication Data

US 2014/0326940 A1   Nov. 6, 2014

Related U.S. Application Data

(60) Provisional application No. 61/819,014, filed on May 3, 2013.

(51) Int. Cl.
*H01L 47/00* (2006.01)
*H01L 27/24* (2006.01)
*H01L 45/00* (2006.01)

(52) U.S. Cl.
CPC ........ *H01L 27/2463* (2013.01); *H01L 27/2409* (2013.01); *H01L 45/085* (2013.01); *H01L 45/1233* (2013.01); *H01L 45/147* (2013.01); *H01L 45/1675* (2013.01)

(58) Field of Classification Search
CPC .............. H01L 21/768; H01L 23/5256; H01L 23/53257; H01L 27/11206; H01L 51/5012; H01L 51/5253

USPC ........... 257/2–4, E21.004, E45.001; 438/382, 438/384

See application file for complete search history.

(56) References Cited

U.S. PATENT DOCUMENTS

| | | | |
|---|---|---|---|
| 5,687,112 A | 11/1997 | Ovshinsky | |
| RE37,256 E | 7/2001 | Cohen et al. | |
| 7,742,112 B2 | 6/2010 | Haramoto et al. | |
| 2011/0070713 A1* | 3/2011 | Nansei | 438/382 |
| 2013/0187114 A1* | 7/2013 | Kai et al. | 257/3 |

* cited by examiner

*Primary Examiner* — Mark A Laurenzi
(74) *Attorney, Agent, or Firm* — Oblon, McClelland, Maier & Neustadt, L.L.P.

(57) ABSTRACT

A semiconductor memory device according to an embodiment has a memory cell array including: a plurality of lower wirings extending in the first direction; a plurality of upper wirings extending in the second direction, the upper wirings placed above the plurality of lower wirings; a plurality of memory cells provided at respective crossings of the plurality of lower wirings and the plurality of upper wirings; and an interlayer insulating film provided between the plurality of memory cells adjacent in the second direction, and the device is characterized in that the upper wiring includes: an upper firing first section deposited on the memory cell; and an upper wiring second section deposited on the interlayer insulating film, the upper wiring second section larger in crystal grain size than the upper wiring first section, and an upper surface of the memory cell is lower than an upper surface of the interlayer insulating film.

19 Claims, 11 Drawing Sheets

DEPTH α OF UPPER SURFACE OF MEMORY
CELL LAYER TO UPPER SURFACE OF
INTERLAYER INSULATING FILM

SEMICONDUCTOR MEMORY DEVICE AND PRODUCTION METHOD THEREOF

CROSS-REFERENCE TO RELATED APPLICATION

This application is based upon and claims the benefit of priority from the prior U.S. Provisional Application 61/819,014, filed on May 3, 2013, the entire contents of which are incorporated herein by reference.

BACKGROUND

1. Field

Embodiments of the present invention relates to a semiconductor memory device and a production method of the device.

2. Description of the Related Art

As a technique for further shrinking of memory cells, resistance-change semiconductor memory devices have been proposed in which variable resistive elements are used for memory cells. A phase-change memory element that a resistance value changed depending on the crystalline/amorphous state change of a chalcogenide compound, an MRAM element that uses changes in resistance due to a tunnel magnetoresistance effect, a polymer ferroelectric RAM (PFRAM) memory element that has a resistive element formed from a conductive polymer, an ReRAM element that induces changes in resistance by applying electrical pulses, etc. are known as the variable resistive elements.

In the case of the semiconductor memory devices with the use of the variable resistive elements, semiconductor memory devices can be achieved which are large in capacity and small in chip size, because the size per memory cell can be reduced, and additionally, because the memory cell array can be three-dimensionally structured.

BRIEF DESCRIPTION OF THE DRAWINGS

FIGS. 13 through 15A and 15B are examples of cross-sectional views of memory cell arrays for explaining the crystal grain size of wiring in the semiconductor memory device according to the embodiment;

DETAILED DESCRIPTION

A semiconductor memory device according to an embodiment has, when two directions crossing one another are referred to as a first direction and a second direction, whereas a direction crossing the first direction and the second direction is referred to as a vertical direction, a memory cell array including: a plurality of lower wirings extending in the first direction; a plurality of upper wirings extending in the second direction, the upper wirings placed above the plurality of lower wirings; a plurality of memory cells provided at respective crossings of the plurality of lower wirings and the plurality of upper wirings; and an interlayer insulating film provided between the plurality of memory cells adjacent in the second direction, and the device is characterized in that the upper wiring includes: an upper firing first section deposited on the memory cell; and an upper wiring second section deposited on the interlayer insulating film, the upper wiring second section larger in crystal grain size than the upper wiring first section, and an upper surface of the memory cell is lower than an upper surface of the interlayer insulating film.

Semiconductor memory devices and production method thereof according to embodiments will be described below with reference to the drawings.

First Embodiment

First, the general configuration of a semiconductor memory device according to a first embodiment will be described.

Figure 1:
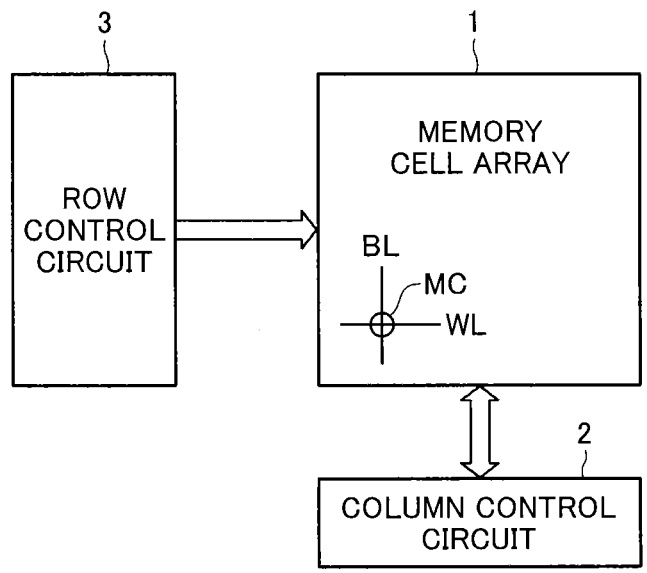
FIG. 1 is an example of a block diagram illustrating the configuration of a semiconductor memory device according to a first embodiment.

FIG. 1 is an example of a block diagram illustrating the configuration of the semiconductor memory device according to the present embodiment. This semiconductor memory device includes a memory cell array 1. The memory cell array 1 includes a plurality of memory cells MC arranged in a matrix form, and a plurality of word lines WL (lower wirings) and a plurality of bit lines BL (upper wirings) for selecting the plurality of memory cells MC.

The memory cell array 1 has the word lines WL electrically connected to a row control circuit 3 that selects the word lines WL to make it possible to erase data in the memory cells MC, write data in the memory cells MC, and read out data from the memory cells MC. Furthermore, the memory cell array 1 has the bit lines BL electrically connected to a column control circuit 2 that controls the bit lines BL to make it possible to erase data in the memory cells MC, write data in the memory cells MC, and read out data from the memory cells MC.

Next, the structure of the memory array 1 will be described.

Figure 2:
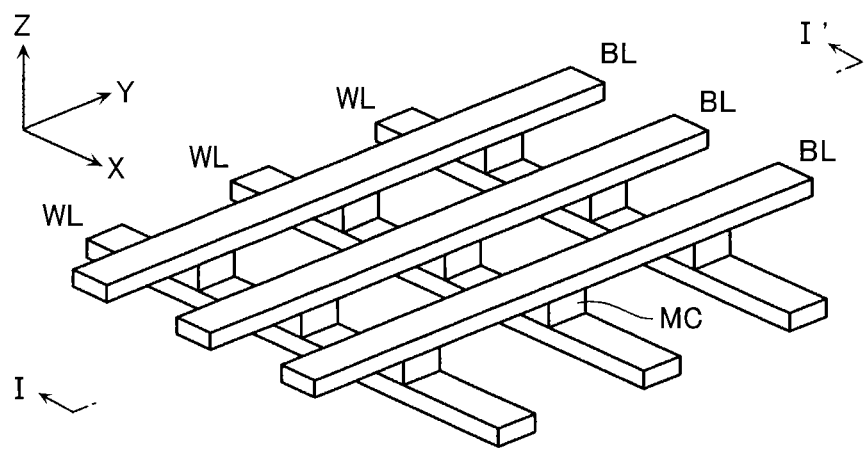
FIG. 2 is an example of a perspective view illustrating a portion of a memory cell array in the semiconductor memory device according to the embodiment.

FIG. 2 is an example of a perspective view illustrating a portion of a memory cell array in the semiconductor memory device according to the present embodiment. In FIG. 2, the row direction is shown as the "X direction" (first direction), the column direction is shown as the "Y direction" (second direction), and the vertical direction crossing the row direction and the column direction is shown as the "Z direction". The same applies to the subsequent diagrams.

The memory cell array 1 includes a plurality of bit lines BL extending in the column direction, a plurality of word lines WL extending in the row direction, and memory cells MC arranged at the respective crossings of the plurality of bit lines BL and the plurality of word lines WL so as to be sandwiched by the both wirings. For the bit lines BL and the word lines WL, materials are desirable which are resistant to heat and low in resistance value, and for example, W, WSi, NiSi, CoSi, and the like can be used.

Next, the memory cells MC will be described.

Figure 3A:
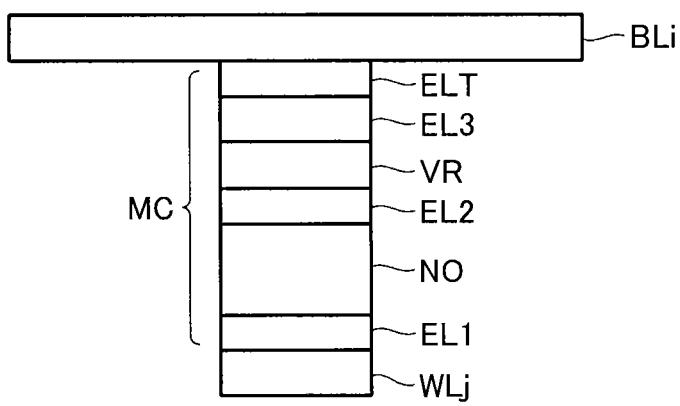
FIG. 3A is an example of a cross-sectional view for one memory cell in the semiconductor memory device according to the embodiment.
Figure 3B:
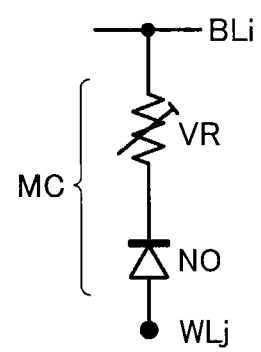
FIG. 3B is an example of an equivalent circuit schematic of the memory cell in the semiconductor memory device according to the embodiment.

FIGS. 3A and 3B are a cross-sectional view and an equivalent circuit schematic of a memory cell in the semiconductor memory device according to the present embodiment. FIG. 3A is an example of a cross-sectional view for one memory cell cut along the line I-I' in FIG. 2, and viewed in an in the direction of an arrow.

The memory cell MC is, as shown in FIG. 3B, composed of a circuit that has a variable resistive element VR and a non-ohmic element NO connected in series.

As the variable resistive element VR which can vary in resistance value with current, heat, chemical energy, or the like by applying a voltage, electrodes EL2 and EL3 are placed which function an upper barrier metal and a lower adhesive layer. Pt, Au, Ag, TiAlN, SrRuO, Ru, RuN, Ir, Co, Ti, TiN, TaN, LaNiO, Al, PrIrO$_x$, PtRhO$_x$, Rh/TaAlN, etc. are used as the electrode materials. Further, a top electrode ELT composed of W or the like for uniform orientation may be placed on the electrode EL3 as shown in FIG. 3B, if necessary. In addition, it is also possible to insert a buffer layer, a barrier metal layer, an adhesive layer, etc. separately in the memory cells MC.

The variable resistive element VR can use an element that has a resistance value changed depending on a phase transition between a crystalline state and an amorphous state, such as chalcogenide, an element that has an oxide film resistance changed by changing the oxygen concentration of the film, an element that has a resistance value changed by depositing metal cations to form cross-linkages (conducting bridges) between electrodes or ionizing the deposited metal to destroy the cross-linkages, and an element (ReRAM) that has a resistance value changed by applying a voltage or a current, etc.

Figure 4:
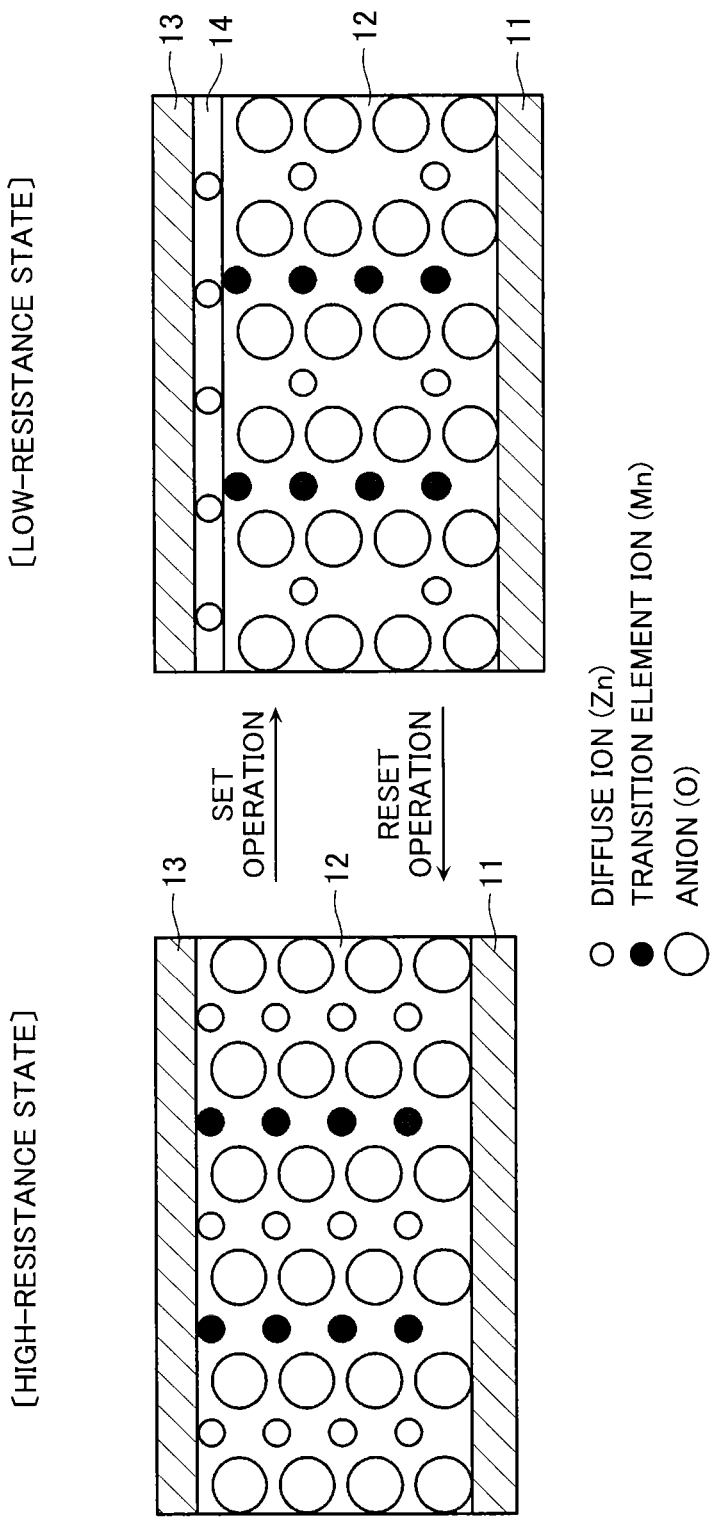
FIG. 4 is an example of a diagram illustrating an example of a variable resistive element in the semiconductor memory device according to the embodiment.

FIG. 4 is a diagram illustrating an example of a ReRAM element. The ReRAM element shown in FIG. 4 has a recording layer 12 placed between electrode layers 11 and 13. The recording layer 12 is composed of a composite compound including at least two types of cationic elements. At least one of the cationic elements is a transition element that has a d orbital incompletely filled with electrons, and shortest distance between adjacent cationic elements is 0.32 nm or less. Specifically, the composite compound is represented by a chemical formula $A_xM_yX_z$ (A and M are different elements from each other), and composed of a material that has crystalline structure such as, for example, a spinel structure ($AM_2O_4$), an ilmenite structure ($AMO_3$), a delafossite structure ($AMO_2$), a LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A represents Zn, M represents Mn, and X represents O. In the recording layer 12, a smaller white circle, a larger white circle, and a smaller black circle respectively represents a diffuse ion (Zn), an anion (O), and a transition element ion (Mn). The initial state of the recording layer 12 is a high-resistance state, and when a negative voltage is applied to the electrode layer 13 with the electrode layer 11 at a fixed electric potential, some of diffuse ions in the recording layer 12 move to the electrode layer 13, and the number of diffuse ions in the recording layer is decreased relatively with respect to anions. The diffuse ions moving to the electrode layer 13 receive electrons from the electrode layer 13 to deposit as metal, and thus form a metal layer 14. The excessive anions in the recording layer 12 results in an increase in the valence of the transition element ion in the recording layer 12. Thus, the carrier injection provides the recording layer 12 with electron conductivity to complete the set operation. For reproduction, a minute electric current value may be applied to such an extent that the material constituting the recording layer 12 cause no change in resistance. In order to reset the program state (low-resistance state) to the initial state (high-resistance state), for example, a large current may be applied to the recording layer 12 for a sufficient period of time to carry out Joule heating, and accelerate the redox reaction of the recording layer 12. In addition, it is also possible to carry out the reset operation by applying an electric field reversed from that in the setting.

The non-ohmic element NO is composed of, for example, various types of diodes such as a Schottky diode, a PN junction diode, and a PIN diode, a MIM (Metal-Insulator-Metal) structure, a SIS structure (Silicon-Insulator-Silicon), etc. The electrodes EL1 and EL2 for forming a barrier metal layer and adhesive layer may be also inserted therein. Pt, Au, Ag, TiAlN, SrRuO, Ru, RuN, Ir, Co, Ti, TiN, TaN, LaNiO, Al, PrIrO$_x$, PtRhO$_x$, Rh/TaAlN, etc. are used as the electrode materials. In addition, in the case of using a diode, unipolar operation can be carried out in consideration of characteristics, whereas it is possible to carry out bipolar operation in the case of a MIM structure, an SIS structure, or the like. It is to be noted that the non-ohmic element NO and the variable resistive element VR may be arranged upside down with respect to FIG. 3, and the polarity of the non-ohmic element NO may be reversed vertically.

Next, steps of producing the memory cell array 1 will be described.

FIGS. 5 to 10 are examples of perspective views illustrating, in the order of steps, the steps of producing the memory cell array in the semiconductor memory device according to the present embodiment.

Figure 5:
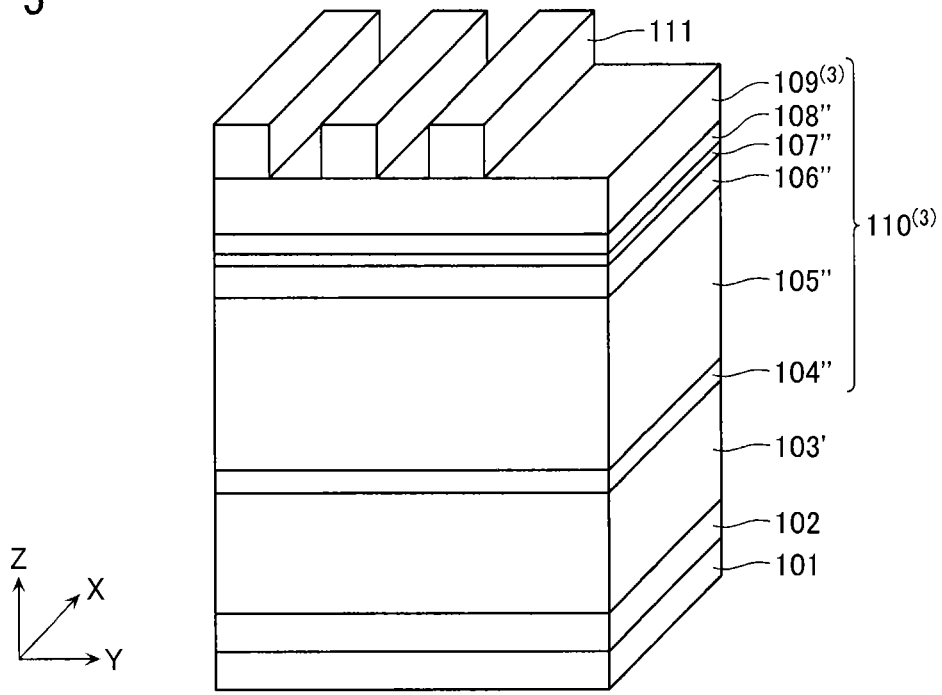
FIGS. 5 to 10 are examples of perspective views illustrating, in the order of steps, the steps of producing the memory cell array in the semiconductor memory device according to the embodiment.

As shown in FIG. 5, a transistor, etc. (not shown) constituting a peripheral circuit may be formed on a semiconductor substrate 101. An interlayer insulating layer 102 formed of SiO$_2$ or the like is deposited on the transistor, etc. Subsequently, CVD (Chemical Vapor Deposition), PVD (Physical Vapor Deposition), or the like is used to stack a lower wiring layer 103' to serve as the word line WL, a layer 104" to serve as the electrode EL1, a layer 105" to serve as the non-ohmic element NO, a layer 106" to serve as the electrode EL2, a layer 107" to serve as the variable resistive element VR, a layer 108" to serve as the electrode EL3, and a layer 109$^{(3)}$ to serve as the top electrode ELT sequentially on the interlayer insulating layer 102. Among these layers, the layers 104" to 109$^{(3)}$ serve as a memory cell layer 110$^{(3)}$ to serve as the memory cell MC. Thereafter, if necessary, a hard mask composed of SiO$_2$ or the like in a line/space pattern, which extends in the row direction, may be deposited on the 109$^{(3)}$.

Figure 6:
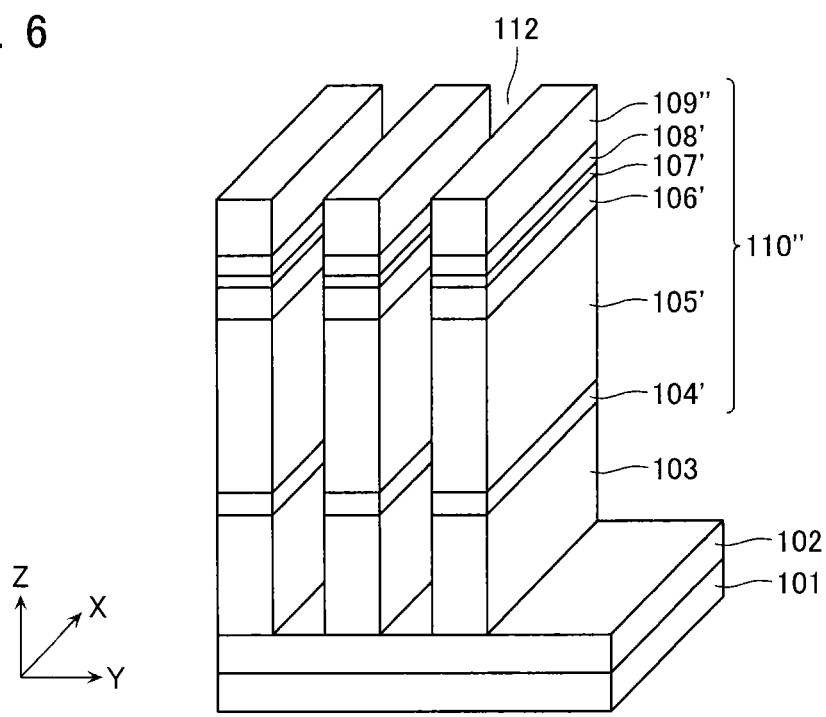

Subsequently, as shown in FIG. 6, for example, a dry etching method is used for the memory cell layer 110$^{(3)}$ and the lower wiring layer 103' to form a plurality of grooves 112 (first grooves) extending in the row direction, until the upper surface of the interlayer insulating layer 102 is exposed. This etching forms the lower wiring layer 103' and the memory cell layer 110$^{(3)}$ into a lower wiring layer 103 and a memory cell layer 110" segmentalized in the row direction. Further, the lower wiring layer 103 serves as the word line WL.

Figure 7:
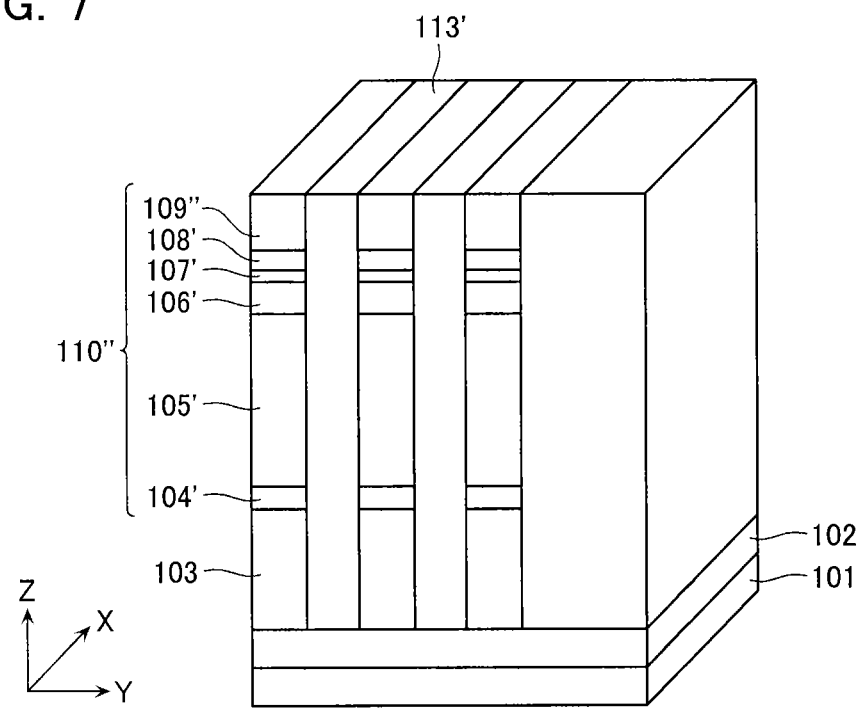

Subsequently, as shown in FIG. 7, the grooves 112 are filled with an interlayer insulating film 113' formed of, for example, SiO$_2$. The upper surfaces of the memory cell layer 110" and interlayer insulating film 113' are smoothed by using CMP (Chemical Mechanical Polish) or the like.

Figure 8:
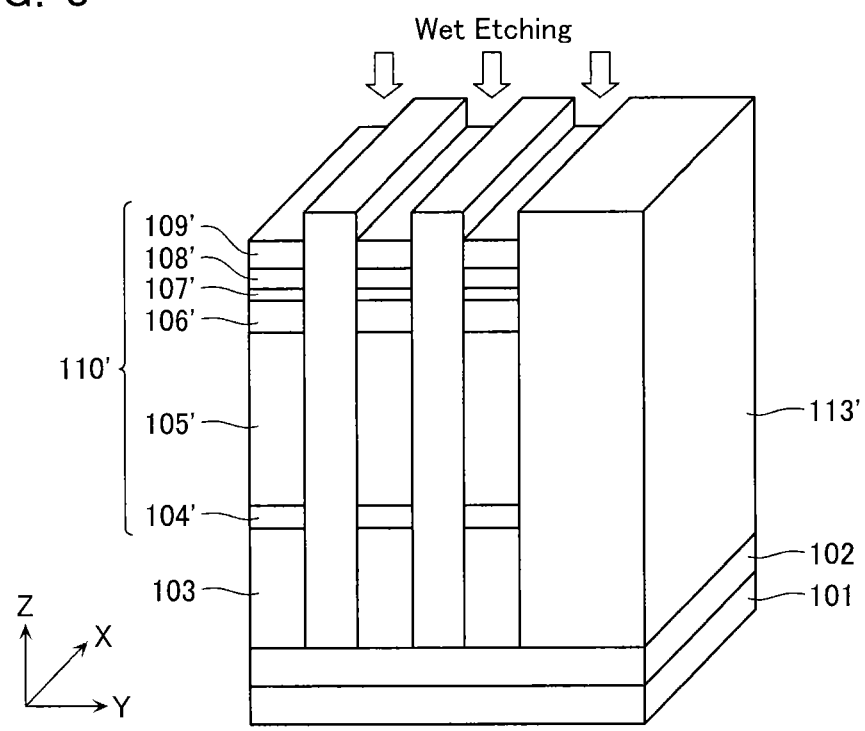

Subsequently, as shown in FIG. 8, an upper portion of the layer 109" to serve as the top electrode ELT is removed about 5 nm to 10 nm by a wet etching method. The wet etching is carried out with the use of an acidic chemical or the like so as to provide a selectivity to the interlayer insulating film 113'. This wet etching forms the layer 109" into a layer 109', and the memory cell layer 110" into a memory cell layer 110'. This step makes the upper surface of the layer 109' to serve as the top electrode ELT lower than the upper surface of the interlayer insulating film 113'.

Figure 9:
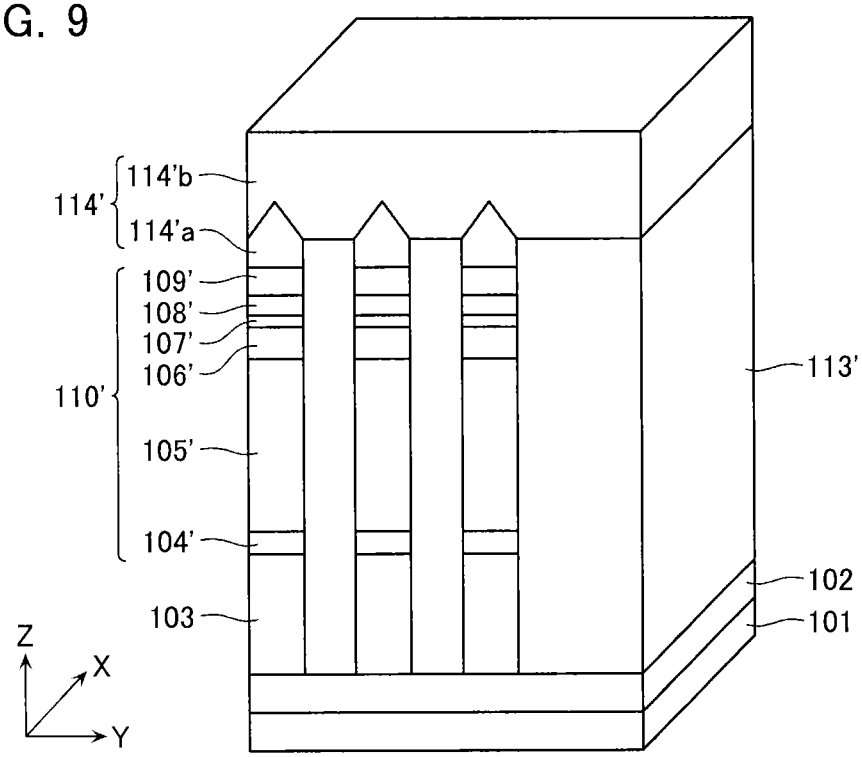

Subsequently, as shown in FIG. 9, for example, a sputtering method is used to deposit an upper wiring layer 114' to serve as the bit line BL on the memory cell layer 110' and the interlayer insulating film 113'. The deposited upper wiring layer 114' herein can be, depending on the difference in average crystal grain size, separated into a first section 114a' (hereinafter, simply referred to as a "first section") deposited on the memory cell layer 110' and a second section 114b' (hereinafter, simply referred to as a "second section") deposited on the interlayer insulating film 113'. It is to be noted that the bit line BL formed from the upper wiring layer 114' and the upper wiring layer 114' will be described in detail later.

Figure 10:
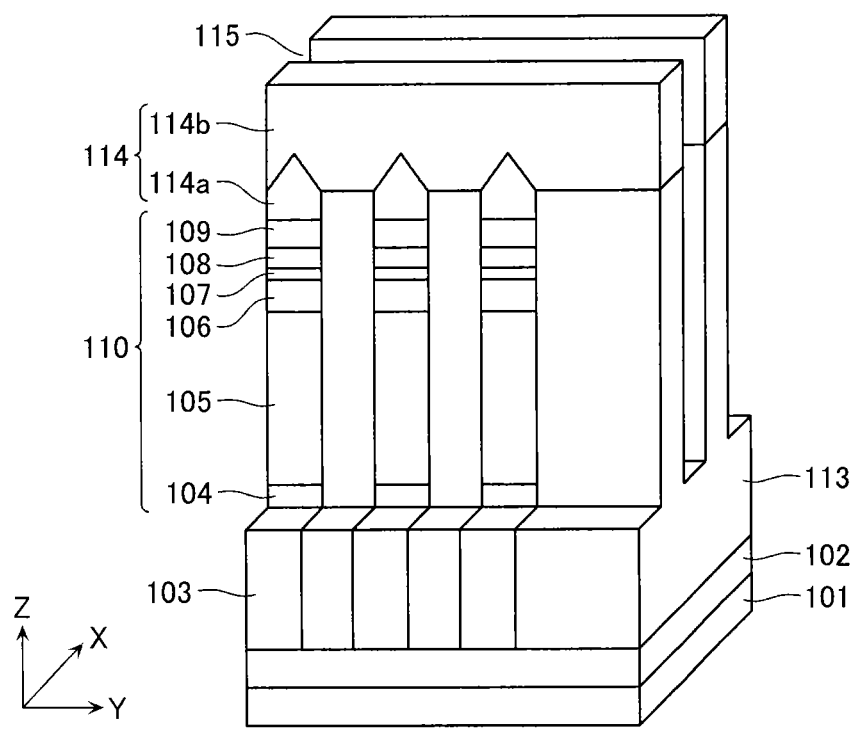

Subsequently, as shown in FIG. 10, a dry etching method or the like is used for the upper wiring layer 114', the interlayer insulating film 113', and the memory cell layer 110' to form a plurality of grooves 115 (second grooves) extending in the column direction, until the upper surface of the lower wiring layer 103 is exposed. This dry etching forms the upper wiring layer 114', the interlayer insulating film 113', and the memory cell layer 110 into an upper wiring layers 114, an interlayer insulating films 113, and a memory cell layers 110 separated in the column direction respectively. Further, the upper wiring layer 114 and the memory cell layer 110 respectively serve as the word line WL and the memory cell MC. It is to be noted that the bottoms of the grooves 115 may be positioned at the upper surfaces of the electrode 104' in the memory cell layer 110'.

If necessary, the grooves 115 are filled with an interlayer insulating film or the like formed of SiO$_2$ or the like, thereby allowing the memory cell array 1 to be produced.

Next, advantageous effects will be described with reference to the memory cell array 1 produced in accordance with the steps described above.

First of all, properties will be described with reference to the first section 114a and second section 114b of the upper wiring layer 114 (bit line BL).

Figure 11:
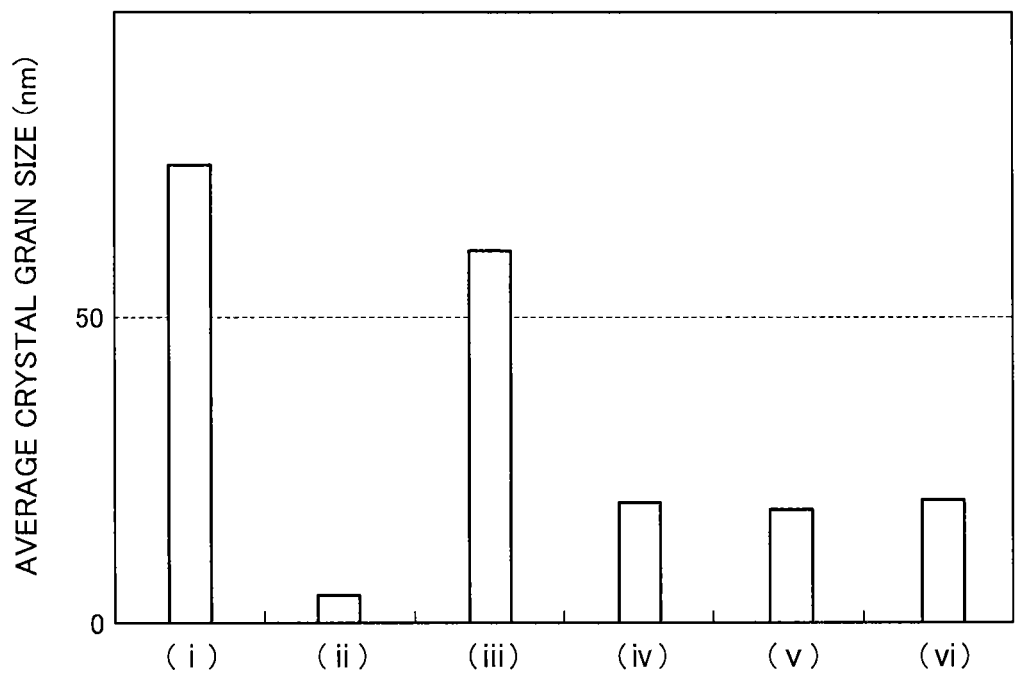
FIG. 11 is an example of a graph showing the relationship between a combination of a base material with a wiring material and the crystal grain size of wiring.

FIG. 11 is a graph showing the relationship between a combination of a base material with a wiring material and the crystal grain size of wiring. FIG. 11 shows: (i) a case of using a base of SiO$_2$ and a wiring of 50 nm thick W; (ii) a case of using a base of SiO$_2$ and 10 nm thick TiN and a wiring of 50 nm thick WN; (iii) a case of using a base of SiO$_2$ and 10 nm thick WN and a wiring of 50 nm thick W; (iv) a case of using a base of SiO$_2$ and 10 nm thick TiN and a wiring of 50 nm thick W; (v) a case of using a base of SiO$_2$ and 10 nm thick TiN and a wiring of 50 nm thick WN; and (vi) a case of using a base of SiO$_2$, 10 nm thick TiN, and 10 nm thick WN and a wiring of 50 nm thick W.

As is clear from this graph, regardless of the wiring material W or WN, the wirings have a relatively large average crystal grain size of 50 nm or more in the case of the bases without TiN, whereas the wirings have a small average crystal grain size not more than the half in the case of the bases with TiN. In other words, the wiring resistance is lower in the case of the bases without TiN, whereas the wiring resistance is higher in the case of the bases with TiN.

Figure 12:
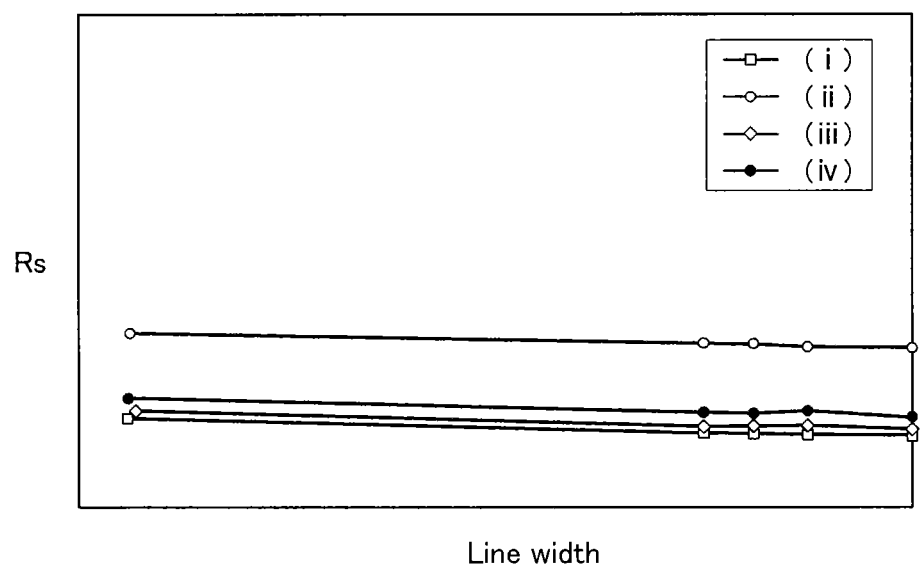
FIG. 12 is an example of a graph showing the relationship between the wiring thickness for each base material and the sheet resistance of wiring.

FIG. 12 is an example of a graph showing the relationship between the wiring thickness for each base material and the sheet resistance of wiring. FIG. 12 is a case of a wiring of 100 nm in thickness. In addition, FIG. 12 shows: (i) a case without a base; (ii) a case of using a base of 5 nm thick TiN; (iii) a case of using a base of 5 nm WN; and (iv) a case of using a base of 10 nm thick WN. In each case, the wiring is formed from a film of W.

When the wiring is 100 nm in thickness, as shown in FIG. 12, the sheet resistance Rs of the wiring is not largely dependent on the wiring width, and the sheet resistance in the case of the base without TiN has a value on the order of twice as large as the sheet resistance in the case of the base with TiN. As described above, it is determined that the wiring resistance varies widely depending on the base material on which the wiring is deposited, even when the same wiring material is used.

The foregoing is applied to the upper wiring layer 114 (bit line BL) produced in accordance with the steps shown in FIGS. 5 to 10. When TiN is used as the material of the electrode EL3, the first section 114a' deposited on the memory cell layer 110' is smaller in crystal grain size than the second section 114b' of SiO$_2$ as a material. More specifically, it is determined that the sheet resistance of the first section 114a' is larger in resistance value than the sheet resistance of the second section 114b'. Thus, as long as the upper wiring layer 114' is deposited so that the proportion of the second section 114b' is higher than that of the first section 114a', the wiring resistance of the bit line BL can be kept low.

Therefore, in the present embodiment, the proportions of the first section 114a' and second section 114b' of the upper wiring 114 are adjusted by adjusting the levels of the upper surfaces of the memory cell layer 110' and interlayer insulating film 113'.

FIGS. 13 through 15A and 15B are cross-sectional views of a memory cell arrays for explaining differences in crystal grain size of wiring in the semiconductor memory device according to the present embodiment.

In the case of the producing method according to the present embodiment, the upper wiring layer 114' is deposited by using, for example, a sputtering method as shown in FIG. 9. In this case, due to the nature of the sputtering method, the growth rate is quicker as the upper surface of the base is raised in position. Therefore, the first section 114a' and second section 114b' of the upper wiring layer 114' are specifically as follows.

Figure 13:
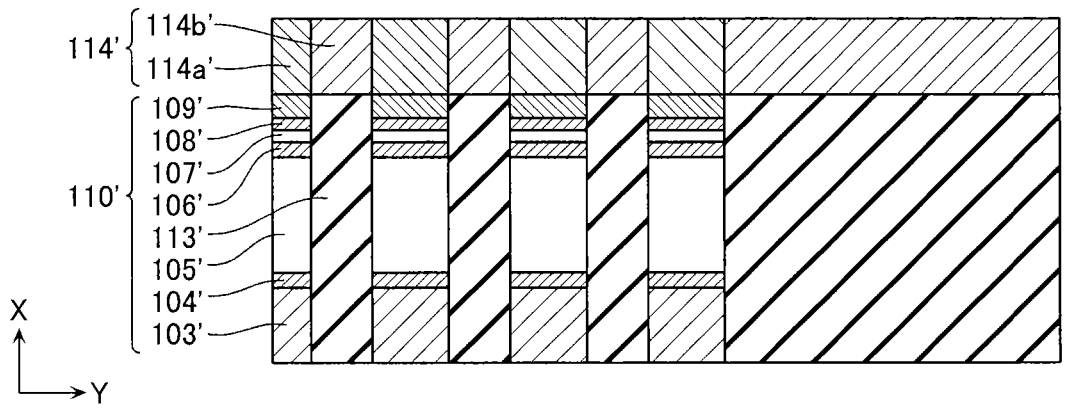

FIG. 13 shows a case of depositing the upper wiring layer 114' after leveling the upper surface of the memory cell layer 110' and the upper surface of the interlayer insulating film 113'. In this case, the first section 114a' grown from the upper surface of the memory cell layer 110' and the second section 114b' grown from the upper surface of the interlayer insulating film 113' are approximately comparable in growth rate, and the first section 114a' and the second section 114b' are thus both substantially quadrilateral.

Figure 14A:
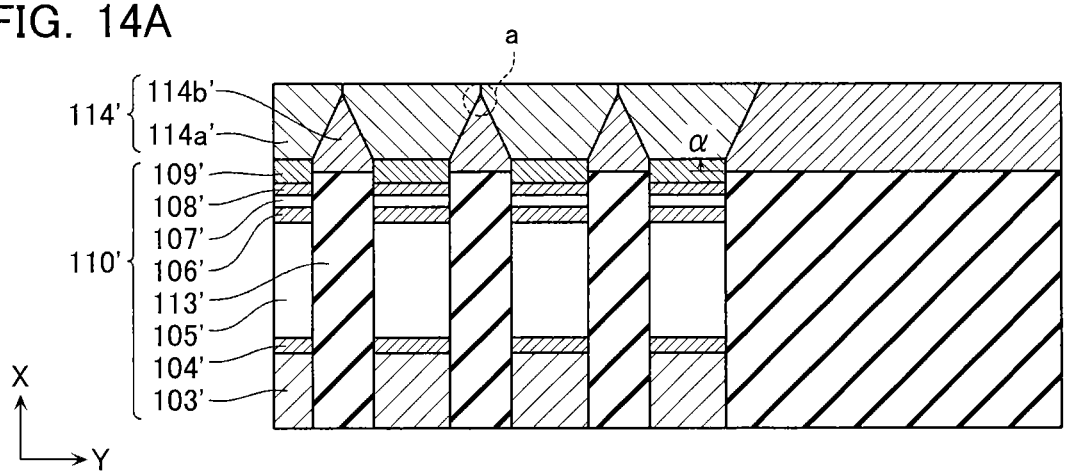

On the other hand, FIG. 14A shows a case of depositing the upper wiring layer 114' after lowering (concaving) the upper surface of the interlayer insulating film 113' with respect to the upper surface of the memory cell layer 110'. In this case, the growth rate of the first section 114a' grown from the upper surface of the memory cell layer 110' is quicker than that of the second section 114b' grown from the upper surface of the interlayer insulating film layer 113'. Then, the first section 114a' is thus grown radially from the upper surface of the memory cell layer 110', whereas the growth of the second section 114b' is suppressed by the first section 114a' at the quicker growth rate. Therefore, the cross section with the row direction of the second section 114b' as a surface normal is shaped to have a smaller width in the column direction on the upper side. As a result, the upper wiring layer 114' is deposited in which the proportion of the first section 114a' is higher as compared with the second section 114b'.

Figure 14B:
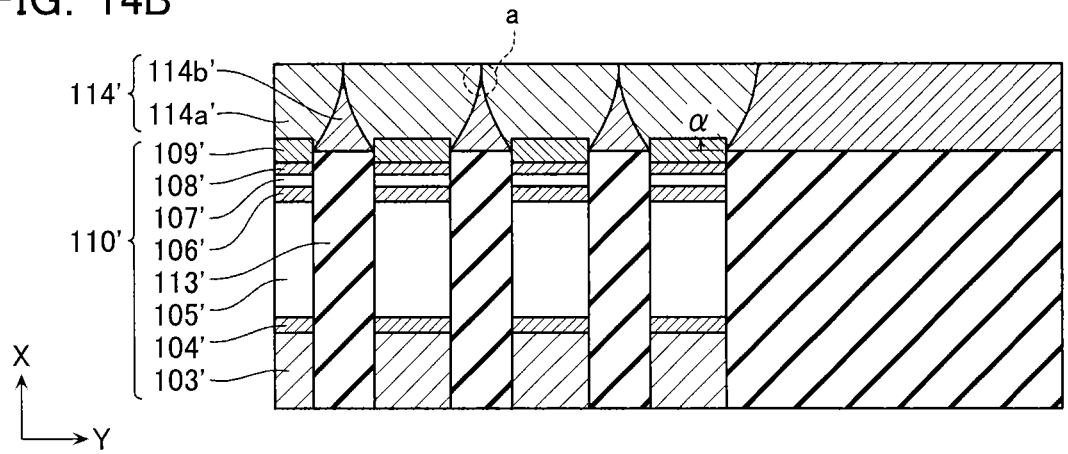

Furthermore, as shown in FIG. 14B, the use of a sputtering method forms the upper wiring layer 114' also from the side surfaces of the layer 109' located above the interlayer insulating film layer 113' in some cases. While the upper wiring layer 114' is also grown from the interlayer insulating film layer 113', the first section 114a' grown from the side surfaces of the layer 109' blocks the growth above the interlayer insulating film layer 113'. As a result, the growth of the second section 114b' is suppressed, and the upper wiring layer 114' is deposited in which the proportion of the first section 114a' is higher as compared with the second section 114b'. In addition, the first section 114a has a curved lower surface.

Figure 15A:
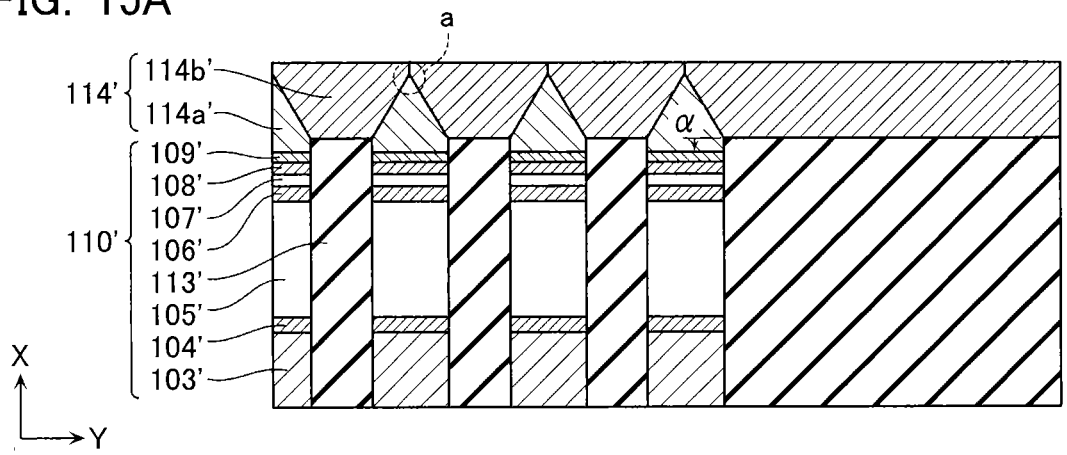

Furthermore, FIG. 15A shows a case of depositing the upper wiring layer 114' after lowering (concaving) the upper surface of the memory cell layer 110' with respect to the upper surface of the interlayer insulating film 113'. In this case, the growth rate of the second section 114b' grown from the upper surface of the interlayer insulating film 113' is quicker than that of the first section 114a' grown from the upper surface of the memory cell layer 110', and the second section 114b' is thus grown radially from the upper surface of the interlayer insulating film 113', whereas the growth of the first section 114a' is suppressed by the second section 114b' at the quicker growth rate. Therefore, the cross section with the row direction of the second section 114b' as a surface normal is shaped to have a smaller width in the column direction on the upper side. As a result, the upper wiring layer 114' is deposited in which the proportion of the second section 114b' is higher as compared with the first section 114a'.

Figure 15B:
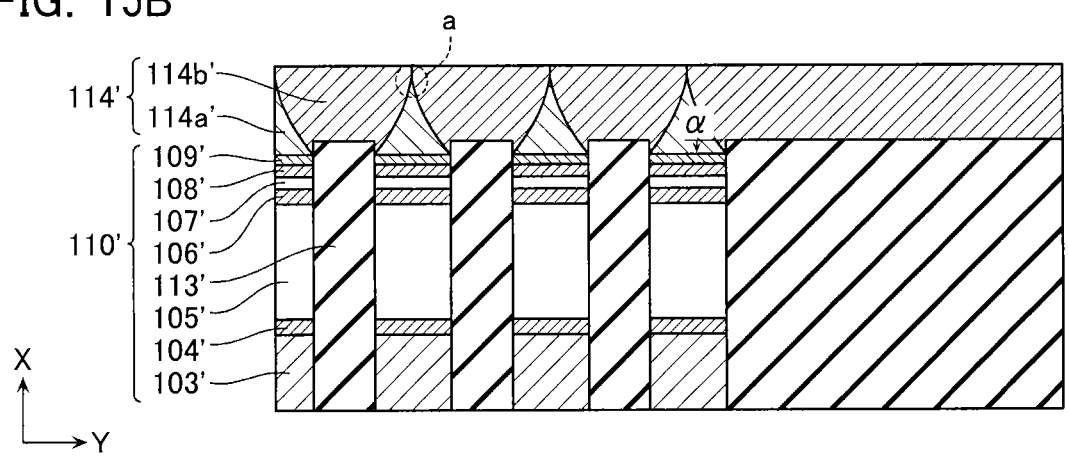

Furthermore, as shown in FIG. 15B, the use of a sputtering method forms the upper wiring layer 114' also from the side surfaces of the interlayer insulating film layer 113' located above the memory cell layer 110' in some cases. While the upper wiring layer 114' is also grown from the memory cell layer 110', the second section 114b' grown from the side surfaces of the interlayer insulating film layer 113' blocks the growth above the memory cell layer 110'. As a result, the growth of the first section 114a' is suppressed, and the upper wiring layer 114' is deposited in which the proportion of the second section 114b' is higher as compared with the first section 114a'. In addition, the second section 114b has a curved lower surface.

Figure 16:
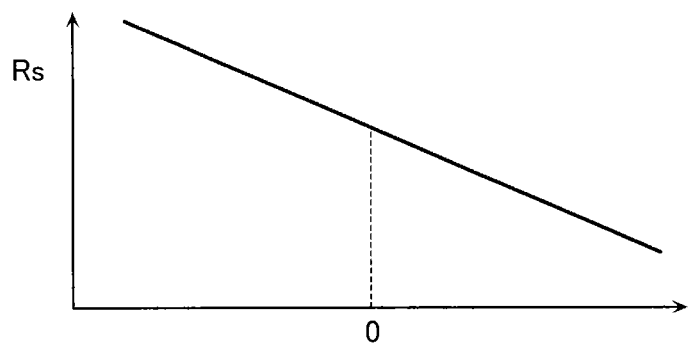
FIG. 16 is an example of a graph showing the relationship between the depth of the upper surface of a memory cell layer to the upper surface of an interlayer insulating film and the sheet resistance of wiring in the semiconductor memory device according to the embodiment.

FIG. 16 is a graph showing the relationship between the depth of the upper surface of a memory cell layer to the upper surface of an interlayer insulating film and the sheet resistance of wiring in the semiconductor memory device according to the present embodiment. FIG. 16 shows a case of using TiN as the material of the electrode EL3 in the memory cell MC, and using $SiO_2$ as the material of the interlayer insulating film.

In this case, as described with reference to FIGS. 11 and 12, the first section 114a' undergoes a decrease in crystal grain size and an increase in sheet resistance by the influence of TiN contained in the base as the material of the electrode EL3. On the other hand, the second section 114b' undergoes an increase in crystal grain size and a decrease in sheet resistance, because no TiN is contained in the base. As a result, as shown in the graph in FIG. 16, the sheet resistance Rs of the entire bit line BL is decreased as the proportion of the second section 114b with a lower sheet resistance is increased, that is, as the depth a of the upper surface of the memory cell layer 110 is increased with respect to the upper surface of the interlayer insulating film 113. At this point, it is not limited the material of the electrode EL3 is TiN. It is possible to use other materials as long as the crystal grain size formed above the electrode EL3 is small.

Figure 17:
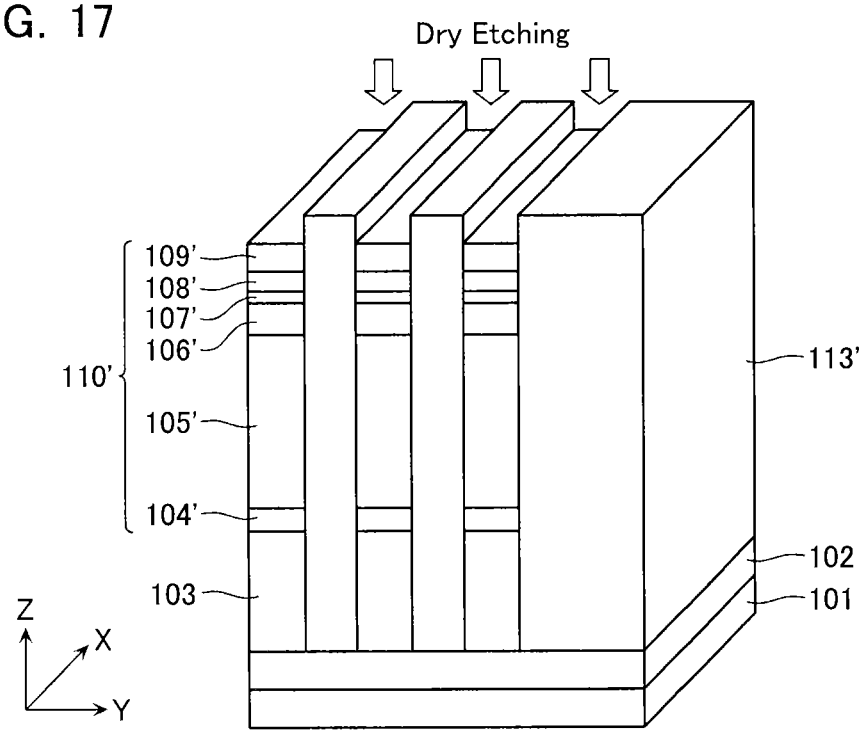
FIG. 17 is an example of a perspective view illustrating a step of producing a memory cell array in a semiconductor memory device according to a second embodiment.

In that regard, according to the steps of producing the memory cell array 1 as shown in FIGS. 5 to 10, the wiring resistance of the bit line BL can be reduced, because the upper surface of the memory cell layer 110' is made lower (concaved) than the upper surface of the interlayer insulating film 113' as shown in FIG. 17.

It is to be noted that the sheet resistance of the second section 114b' is higher than the sheet resistance of the first section 114a' in some cases, depending on the materials of the memory cell layer 110' and interlayer insulating film 113'. In this case, as shown in FIGS. 14A and 14B, the wiring resistance of the bit line BL can be reduced by making (concaving) the upper surface of the interlayer insulating film 113' lower than the upper surface of the memory cell layer 110'.

In addition, when the sheet resistance of the first section 114a' is comparable to the sheet resistance of the second section 114b', the wiring resistance of the bit line BL is not changed even in any case of the relationship between the memory cell layer 110' and the interlayer insulating film 113' in terms of the level of the upper surface. However, as shown in FIGS. 13A and 13B, in the case of leveling the supper surfaces of the memory cell layer 110' and interlayer insulating film 113', there is no need to adjust the level of the upper surface of the memory cell layer 110' or the interlayer insulating film 113', and the production process can be further simplified accordingly.

It is to be noted that when the upper surface of the memory cell layer 110' is made excessively deep with respect to the upper surface of the interlayer insulating film 113', or when the upper surface of the interlayer insulating film 113' is made excessively deep with respect to the upper surface of the memory cell layer 110', voids may be produced in dotted circles as shown in FIGS. 14A, 14B, 15A, and 15B.

Thus, according to the present invention, the proper adjustment made to the levels of the upper surface of the memory cell layer and interlayer insulating film can provide a semiconductor memory device that is low in wiring resistance and low in power consumption, and a production method of the device.

Second Embodiment

In the second embodiment, Steps for removing an upper portion of a memory cell layer will be listed. The steps described herein may be replaced with the step shown in FIG. 8 in the first embodiment. Therefore, the steps other than the steps described herein are the same as in the first embodiment, and descriptions thereof will be thus omitted in the present embodiment.

Figure 18:
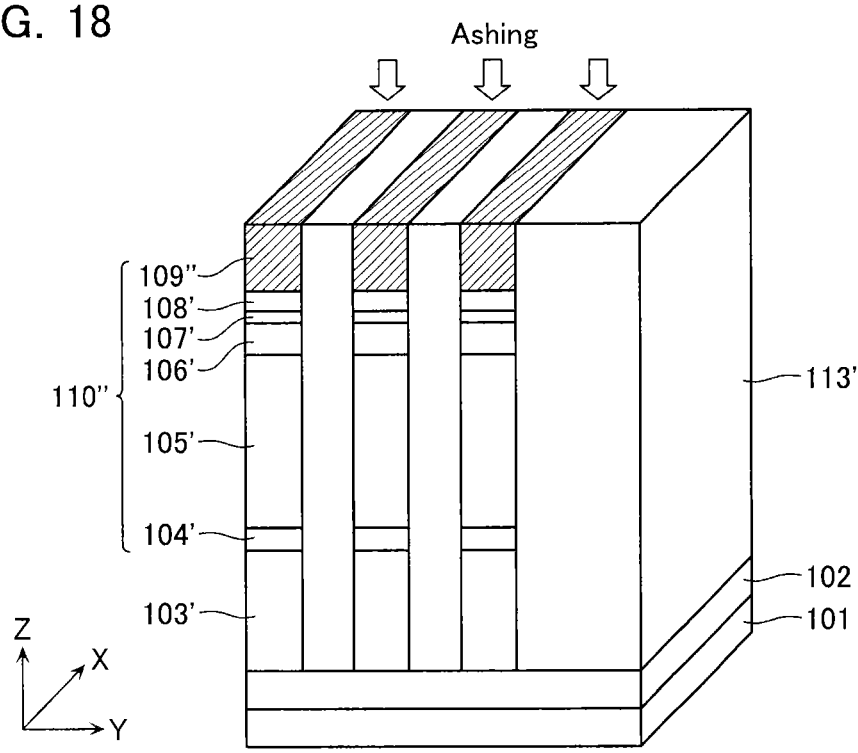
FIG. 18 is an example of a perspective view illustrating another step of producing the memory cell array in the semiconductor memory device according to the embodiment.
Figure 19:
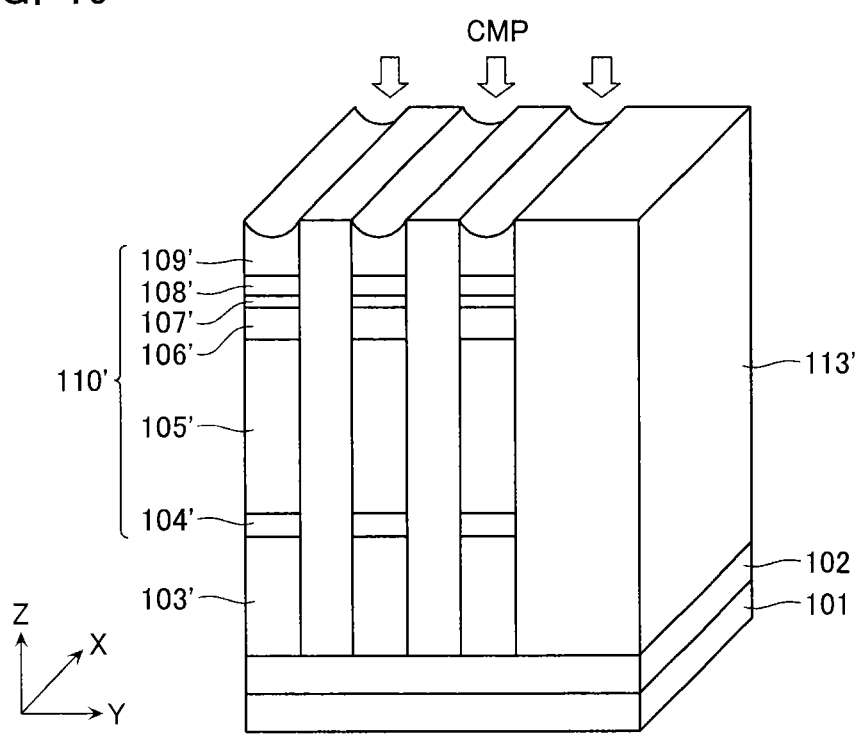
FIG. 19 is an example of a perspective view illustrating another step of producing the memory cell array in the semiconductor memory device according to the embodiment.

FIGS. 17 to 19 are examples of perspective views illustrating steps of producing the memory cell array in the semiconductor memory device according to the present embodiment.

The first of the steps involves a method with the use of a dry etching method. As shown in FIG. 17, the layer 109' to serve as the top electrode ELT of the memory cell MC is removed about 5 nm to 10 nm with the use of a dry etching method.

The second thereof involves a method with the use of an ashing method. As shown in FIG. 18, a surface layer (shaded portions in FIG. 18) of the layer 109" to serve as the top electrode ELT of the memory cell MC is oxidized with the use of an ashing method. Thereafter, the layer 109" with W oxidized to $WO_x$ is removed with the use of a wet etching method. The wet etching can be carried out with the use of an alkaline chemical such as choline, which can selectively remove the surface layer section of the oxidized layer 109".

The third thereof involves a method with the use of CMP. In planarizing the upper surfaces of the memory cell layer 110" and interlayer insulating film 113" by CMP, the upper surface of the layer 109" to serve as the top electrode ELT can be lower (concaved) about 5 nm to 10 nm as shown in FIG. 19 by slightly increasing the etching rate for the layer 109".

While the three methods for the step of removing an upper portion of the memory cell layer have been described above in the present embodiment, the adjustment made to the upper surfaces of the memory cell layer and interlayer insulating film is not limited to these three methods, and carious methods can be used. In any case, the proper adjustment made to the upper surface of the memory cell layer and interlayer insulating film before the deposition of the upper wiring layer can provide a semiconductor memory device that is low in wiring resistance and low in power consumption, and a production method of the device, as in the first embodiment.

Others

While the several embodiments of the present invention have been described above, these embodiments are presented by way of example, but not intended to limit the scope of the invention. These novel embodiments can be implemented in other various embodiments, and various omissions, substitutions, and changes can be made thereto, without departing from the spirit of the invention. These embodiments and modifications thereof fall within the scope and spirit of the invention, and also fall within the invention as claimed in the claims and equivalents thereof.

What is claimed is:

1. A semiconductor memory device comprising,
when two directions crossing one another are referred to as a first direction and a second direction, whereas a direction crossing the first direction and the second direction is referred to as a vertical direction,
a memory cell array comprising: a plurality of lower wirings extending in the first direction; an upper wiring extending in the second direction, the upper wiring placed above the lower wirings; a plurality of memory cells provided at crossings of the lower wirings and the upper wiring; and an interlayer insulating film provided between the memory cells,
the upper wiring including: an upper wiring first section deposited above the memory cells; and an upper wiring second section deposited on the interlayer insulating film, the upper wiring second section having an average crystal grain size larger than an average crystal grain size of the upper wiring first section, and
a height of a bottom surface of the upper wiring facing a top surface of the memory cells in the vertical direction being lower than a height of the bottom surface of the upper wiring facing a top surface of the interlayer insulating film in the vertical direction.

2. The semiconductor memory device according to claim 1,
wherein the memory cells include an upper electrode contacting with the upper wiring, and a variable resistive element connected to the upper electrode in series.

3. The semiconductor memory device according to claim 1,
wherein a cross section of the upper wiring first section along the second direction is shaped to a width gradually decreased in the second direction on an upper side.

4. The semiconductor memory device according to claim 2,
wherein the upper electrode includes a first film comprising titanium nitride (TiN),
the interlayer insulating film comprises a silicon oxide ($SiO_2$), and
the upper wiring comprises tungsten (W).

5. The semiconductor memory device according to claim 1,
wherein a bottom surface of the upper wiring has a convex shape facing downward at positions of the memory cells.

6. A semiconductor memory device comprising,
when two directions crossing one another are referred to as a first direction and a second direction, whereas a direction crossing the first direction and the second direction is referred to as a vertical direction,
a memory cell array comprising: a plurality of lower wirings extending in the first direction; an upper wiring extending in the second direction, the upper wiring placed above the lower wirings; a plurality of memory cells provided at crossings of the lower wirings and the upper wiring; and an interlayer insulating film provided between the memory cells,
the upper wiring including an upper wiring first section deposited above the memory cells; and an upper wiring second section deposited on the interlayer insulating film, the upper wiring second section having an average crystal grain size smaller than an average crystal grain size of the upper wiring first section, and
a height of a bottom surface of the upper wiring facing a top surface of the memory cells in the vertical direction being higher than a height of the bottom surface of the upper wiring facing a top surface of the interlayer insulating film in the vertical direction.

7. The semiconductor memory device according to claim 6,
wherein the memory cells include an upper electrode contacting with the upper wiring, and a variable resistive element connected to the upper electrode in series.

8. The semiconductor memory device according to claim 6,
wherein a cross section of the upper wiring second section along the second direction is shaped to a width gradually decreased in the second direction on an upper side.

9. The semiconductor memory device according to claim 6,
wherein a bottom surface of the upper wiring has a convex shape facing downward at positions of the interlayer insulating film.

10. The semiconductor memory device according to claim 4, further comprising,
a second film comprising tungsten (W) between the upper electrode and the upper wiring.

11. The semiconductor memory device according to claim 1,
wherein a sheet resistance of the upper wiring first section is higher in resistance value than a sheet resistance of the upper wiring second section.

12. The semiconductor memory device according to claim 6,
wherein the upper electrode includes a first film comprising titanium nitride (TiN),
the interlayer insulating film comprises a silicon oxide ($SiO_2$), and
the upper wiring comprises tungsten (W).

13. The semiconductor memory device according to claim 12, further comprising,
a second film comprising tungsten (W) between the upper electrode and the upper wiring.

14. A semiconductor memory device comprising,
when two directions crossing one another are referred to as a first direction and a second direction, whereas a direction crossing the first direction and the second direction is referred to as a vertical direction,
a memory cell array comprising: a plurality of lower wirings extending in the first direction; an upper wiring extending in the second direction, the upper wiring placed above the lower wirings; a plurality of memory cells provided at crossings of the lower wirings and the upper wiring; and an interlayer insulating film provided between the memory cells,
the upper wiring comprising tungsten (W), and including: an upper wiring first section deposited above the memory cells; and an upper wiring second section deposited on the interlayer insulating film, and
the memory cell array including a first film comprising titanium nitride (TiN) in an upper surface side of the memory cells, a height of a bottom surface of the upper wiring facing a top surface of the memory cells in the vertical direction being lower than a height of the bottom surface of the upper wiring facing a top surface of the interlayer insulating film in the vertical direction,
wherein the bottom surface of the upper wiring has a convex shape facing downward at positions of the memory cells.

15. The semiconductor memory device according to claim 14,
wherein the memory cells include an upper electrode including an upper electrode contacting with the upper wiring, and a variable resistive element connected to the upper electrode in series.

16. The semiconductor memory device according to claim 14,
wherein a cross section of the upper wiring second section along the second direction is shaped to a width gradually decreased in the second direction on an upper side.

17. The semiconductor memory device according to claim 14,
wherein the interlayer insulating film comprises a silicon oxide ($SiO_2$).

18. The semiconductor memory device according to claim 15, further comprising,
a second film comprising tungsten (W) between the upper electrode and the upper wiring.

19. The semiconductor memory device according to claim 14,
wherein a sheet resistance of the upper wiring first section is higher in resistance value than a sheet resistance of the upper wiring second section.

* * * * *